United States Patent [19]

Geus

[11] Patent Number: 4,673,884

[45] Date of Patent: Jun. 16, 1987

[54] CIRCUIT FOR MEASURING THE ANODE CURRENT IN AN X-RAY TUBE

[75] Inventor: Georg Geus, Wiesbaden, Fed. Rep. of Germany

[73] Assignee: Heimann GmbH, Wiesbaden, Fed. Rep. of Germany

[21] Appl. No.: 675,514

[22] Filed: Nov. 28, 1984

[30] Foreign Application Priority Data

Dec. 13, 1983 [DE] Fed. Rep. of Germany ....... 3345036

[51] Int. Cl.[4] ............ G01R 31/25

[52] U.S. Cl. ............ 324/407; 315/307; 324/412; 324/403; 378/110

[58] Field of Search ............ 324/407, 408, 409, 410, 324/411, 412, 403, 405; 378/207, 98, 110; 340/640; 315/307, 308

[56] References Cited

U.S. PATENT DOCUMENTS

| | | | |
|---|---|---|---|
| 2,926,302 | 2/1960 | Morelock | 324/408 |
| 3,969,625 | 7/1976 | Tinkenzeller et al. | 378/98 |
| 4,295,049 | 10/1981 | Ebersheger et al. | 378/110 |
| 4,311,913 | 1/1982 | Reinick et al. | 378/110 |

*Primary Examiner*—Reinhard J. Eisenzopf
*Assistant Examiner*—Robert W. Mueller
*Attorney, Agent, or Firm*—Herbert L. Lerner; Laurence A. Greenberg

[57] ABSTRACT

A circuit for measuring anode current in an X-ray tube having an anode and a heater electrode both operable at high voltage, includes a heater transformer generating current pulses with a timewise constant first pulse repetition frequency and an adjustable duty cycle, a first frequency separator connected in series with the heater transformer for receiving the output thereof, a high voltage-proof transformer having a primary winding connected in series with the first frequency separator, and separate first and second secondary windings, the first secondary winding being connected to the heater for supplying heater current for the X-ray tube, an anode circuit connected to the anode of the X-ray tube including a current/duty cycle converter generating a current with a constant second pulse repetition frequency different from the first pulse repetition frequency, the first secondary winding being connected to the current/duty cycle converter for supplying voltage from the high voltage-proof transformer, a second frequency separator connected between the current/duty cycle converter and the second secondary winding of the high voltage-proof transformer for receiving an output signal of the current/duty cycle converter and preventing the first pulse repetition frequency from passing, a duty cycle/voltage converter, and a third frequency separator connected to the duty cycle/voltage converter together being shunted across the primary winding of the high voltage-proof transformer, the third frequency separator passing the second pulse repetition frequency and preventing the first pulse repetition frequency from passing.

5 Claims, 3 Drawing Figures

CIRCUIT FOR MEASURING THE ANODE CURRENT IN AN X-RAY TUBE

Figure 1:
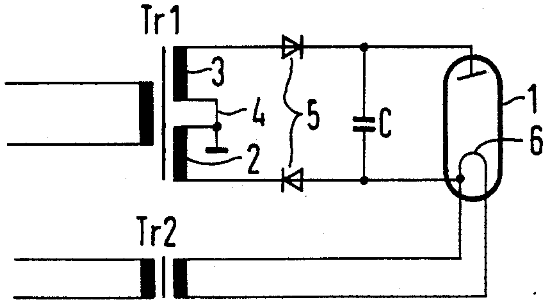
FIG 1 PRIOR ART

The invention relates to a circuit for measuring the anode current in an X-ray tube, particularly one operated symmetrically, in which both electrodes can be operated at high voltage; in which the anode current is converted into a modulated a-c voltage and this a-c voltage is separated from the high voltage by a transformer, and in which this a-c voltage is utilized for the measurement and/or control of the anode current of the X-ray tube. Such a circuit is known in the art.

There is a relationship between the heater current and the anode current of an X-ray tube which changes with the age of the tube and the inside temperature of the tube hood. Controlling the heater current, which is known per se, is therefore not a sufficient means for keeping the power emitted by the tube constant. On the other hand, direct measurement and control of the anode current of a symmetrically operated tube, especially a two-pole tube, is difficult because both electrodes are at high-voltage potential. This results in the problem of potential separation between the current sensor and an external evaluation circuit which must not be at high-voltage potential because of the required simplicity of operation.

Various approaches have already been proposed for solving this problem:

The high-voltage winding of the high-voltage transformer has a grounded center tap. A measurement of the pulse-shaped recharging current which is close to ground is made in vicinity of this center tap, in the connecting line between the two high-voltage winding sections. However, with this measuring method, the active power losses in the rectifiers preceding the X-ray tube are included in the measurement when changing the polarity and the charge reversal connected therewith, as well as the power losses in any smoothing capacitor which may be provided. In addition, the capacitive reactive current of the smoothing capacitors of all capacities located between high voltage-carrying parts and the housing are included in this measurement. Accordingly, too high a measurement value for the current is obtained, and the dependence of the measurement error on the housing temperature and the aging of the equipment is not known. Especially in the case of smoothed high voltage, the reactive currents are also practically inseparable from the active current. Such a modification of the measurement is therefore not possible either.

The approach discussed above in the background of the invention, which is to convert the anode current into a modulated a-c voltage, is accomplished according to the known state of the art by transmitting the a-c voltage through an additional high voltage-proof transformer. In this case, besides the high-voltage transformer proper, two high voltage-proof transformers are required, one of which supplies the heater current and the other of which transmits a modulated a-c voltage proportional to the anode current. Such transformers require an elaborate and special construction and therefore result in high costs. Because of the insulation requirements, they also require a great deal of space.

According to a further proposal, instead of the high voltage-proof transformer, the transmission can be made by optical means, such as through a light-emitting diode, which is at the high potential, and a photo diode at the housing wall, the latter being at ground potential. This embodiment requires an additional expenditure on the receiver side, since an impedance converter or a preamplifier must be located in the immediate vicinity of the photo diode. The preamplifier must be located inside the housing in the insulating medium so that it can be close enough to the photo diode. This converter requires a separate supply voltage fed in from the outside, which results in additional space requirements because of the protection against breakdowns of the high voltage.

It is accordingly an object of the invention to provide a circuit for measuring the anode current in an X-ray tube, which overcomes the hereinafore-mentioned disadvantages of the heretofore-known devices of this general type, to simplify such a device, to achieve a volume reduction as compared to the circuit described above in the background of the invention, and in particular, to avoid the need for a separate high voltage-proof transformer for the transmission of a modulated a-c voltage, without the need for additional current leads which must be protected against high voltage.

With the foregoing and other objects in view there is provided, in accordance with the invention, a circuit for measuring anode current in an X-ray tube, especially a symmetrically operated tube, having an anode and a heater cathode electrode both operable at high voltage, comprising a heater transformer generating current pulses with a time-wise constant first pulse repetition frequency and an adjustable duty cycle, a first frequency separator connected in series with the heater transformer for receiving the output thereof, a high voltage-proof transformer having a primary winding connected in series with the first frequency separator, and separate first and second secondary windings, the first secondary winding being connected to the heater for supplying heater current for the X-ray tube, an anode circuit connected to the anode of the X-ray tube including a current/duty cycle converter generating a current with a constant second pulse repetition frequency different from the first pulse repetition frequency of the heater transformer, the first secondary winding being connected to the current/duty cycle converter for supplying voltage from the high voltage-proof transformer, a second frequency separator connected between the current/duty cycle converter and the second secondary winding of the high voltage-proof transformer for receiving an output signal of the current/duty cycle converter and preventing the first pulse repetition frequency of the heater transformer from passing, a duty cycle/voltage converter, and a third frequency separator connected to the duty cycle/voltage converter together being shunted across the primary winding of the high voltage-proof transformer, the third frequency separator passing the second pulse repetition frequency of the current/duty cycle converter and preventing the first pulse repetition frequency of the heater transformer from passing.

The circuit according to the invention has the advantage of simultaneously permitting the isolation of the d-c potentials, the transmission of the heater power, the availability of a supply voltage for a current/duty cycle converter and the retransmission of a frequency modulated in accordance with the anode current, without requiring appreciably more space than is required if only one high voltage-proof transformer is used.

The frequencies used can basically be chosen freely as long as the pulse repetition frequency of the heater transformer can be separated properly from the pulse repetition frequency of the current/duty cycle converter by bypass filters.

In accordance with another feature of the invention, there is provided a fourth frequency separator connected between the second secondary winding and the current/duty cycle converter for passing the first pulse repetition frequency, the first pulse repetition frequency generated by the heater transformer being higher than the second pulse repetition frequency generated by the current/duty cycle converter, the first and fourth frequency separators for passing the first pulse repetition frequency of the heater transformer being highpass filters, and the second and third frequency separators for passing the second pulse repetition frequency of the current/duty cycle converter being lowpass filters.

In accordance with a further feature of the invention, the first pulse repetition frequency of the heater transformer is substantially 20 kHz and the second pulse repetition frequency of the current/duty cycle converter is substantially 1 kHz. This allows for a simple construction of the frequency separators.

In the first and second embodiments of the circuit according to the invention which will be described below with the aid of the drawings, in principle, the transformer generates a negative feedback for a change in the anode current, by reducing the load of the transformer with the current/duty cycle converter and reducing the heater current with the output voltage generated by the former. This property applies substantially to the first embodiment of the circuit according to the invention shown in the figures.

Generally, however, this influence is not to be utilized, but is instead to be avoided in favor of a more precise external control. In accordance with an added feature of the invention, the current/duty cycle converter and the duty cycle/voltage converter have a smaller power loss than the power loss in the heater of the X-ray tube, and the current/duty cycle converter generates a flux change in the high voltage-proof transformer which is smaller than the flux change generated in the high voltage-proof transformer by the heater transformer. The second embodiment of the circuit according to the invention shown in the figures meets this requirement.

The output voltage obtained at the duty cycle/voltage converter is proportional to the anode current of the X-ray tube and can be used for measuring the anode current or for regulating the same.

In accordance with a concomitant feature of the invention, the current/duty cycle converter is connected in series with the heater of the X-ray tube and the first secondary winding, for voltage supply.

Other features which are considered as characteristic for the invention are set forth in the appended claims.

Although the invention is illustrated and described herein as embodied in a circuit for measuring the anode current in an X-ray tube, it is nevertheless not intended to be limited to the details shown, since various modifications and structural changes may be made therein without departing from the spirit of the invention and within the scope and range of equivalents of the claims.

Figure 2:
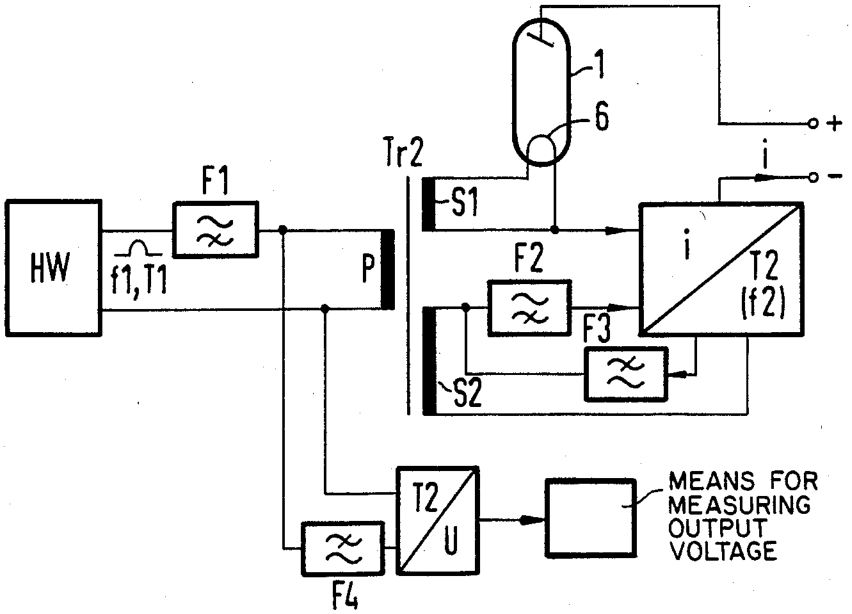
Figure 3:
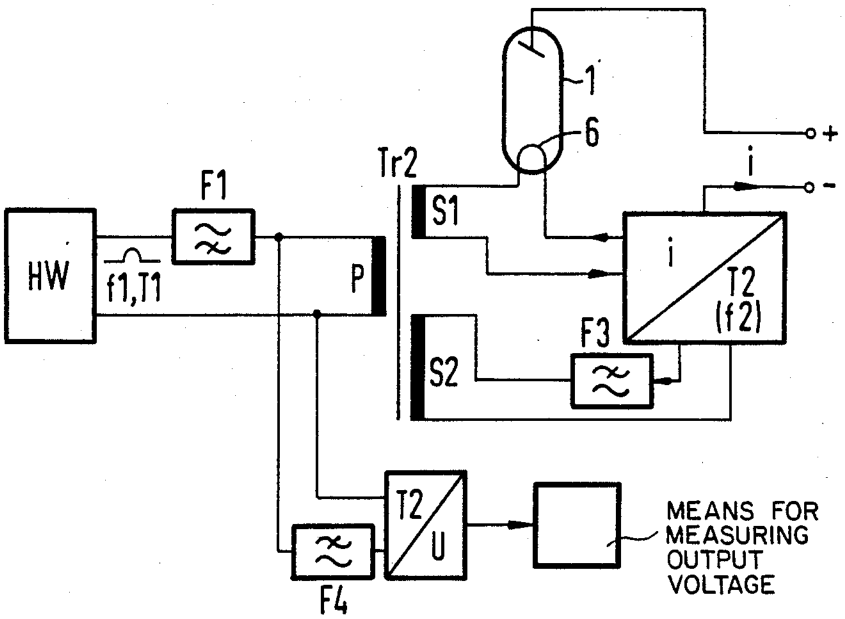

The construction and method of operation of the invention, however, together with additional objects and advantages thereof will be best understood from the following description of specific embodiments when read in connection with the accompanying drawings, in which:

FIG. 1 is a schematic circuit diagram showing the customary drive of a two-pole tube; and FIGS. 2 and 3 are schematic circuit diagrams of two embodiments according to the invention, omitting details regarding the high-voltage power supply.

Referring now to the figures of the drawings in detail and first particularly to FIG. 1 thereof, it is seen that both poles of an X-ray tube 1 are at high voltage.

The high voltage is obtained from two secondary windings 2 and 3 of a high-voltage transformer Tr1. The two secondary windings 2 and 3 are interconnected in series and the junction point 4 of the connection is connected to ground. A smoothed anode voltage is generated by rectifiers 5 and a capacitor C. The heater 6 of the tube 1 is fed through a high voltage-proof transformer Tr2.

A pulse-shaped current is fed to the primary side P of the high voltage-proof transformer Tr2 from a heater transformer HW through a highpass filter F1, according to the invention as shown in FIGS. 2 and 3. This pulse-shaped current preferably has a constant pulse repetition frequency f1 and a variable duty cycle T1. In this context, "duty cycle" is understood to mean the ratio of the pulse width to the period. The pulse repetition frequency f1 in this case is advantageously about 20 kHz; a highpass filter which passes frequencies between 20 kHz and 100 kHz yields adavantageous values.

One secondary winding S1 of the transformer Tr2 feeds the heater 6 of the tube. The anode current of the X-ray tube 1 is conducted through a current/duty cycle converter i/T2. The current/duty cycle converter i/T2 generates current pulses with a constant pulse repetition frequency f2; the duty cycle of the pulses varies in proportion to the anode current i.

According to FIG. 2, the current/duty cycle converter i/T2 is supplied with a supply voltage from a separate secondary winding S2 through a highpass filter F2 serving as a frequency separator. The highpass filter F2 passes the pulse repetition frequency f1 of the heater transformer, but not the pulse repetition frequency f2 of the current/duty cycle converter i/T2. The signal output of the current/duty cycle converter i/T2 is connected through a lowpass filter F3 serving as a frequency separator, to the separate secondary winding S2 of the transformer Tr2. The voltage occurring at the primary winding P of the high voltage-proof transformer Tr2 which is separated according to high voltage, is taken off and fed through a lowpass filter F4 serving as a frequency separator to a duty cycle/voltage converter T2/U. The lowpass filter F4 allows the passage of the pulses of the current/duty cycle converter i/T2 which arrive with a low pulse repetition frequency, but blocks the pulses coming from the heater transformer HW with the pulse repetition frequency f1. The output voltage of the duty cycle/voltage converter T2/U is proportional to the anode current i of the X-ray tube 1 and can be used for measuring or directly controlling the anode current. For the purpose of control, a compensating method may be used which is based on comparison with a reference voltage.

According to the embodiment of FIG. 3, the heater current flows through the tube cathode 6 and the series-connected power supply of the current/duty cycle converte i/T2. The signal output of the current/duty cycle converter is connected through a lowpass filter F3 operating as a frequency separator, to the separate secondary winding S2 of the transformer Tr2. The signal recovery on the primary side of the high voltage-proof transformer Tr2 is accomplished in the same manner as in the circuit according to FIG. 2.

The circuit embodiment according to FIG. 2 is applicable where large operating point changes of the heater current are requried, since in the FIG. 2 circuit, the power supply is obtained from the separate winding S2.

The circuit embodiment according to FIG. 3 is advantageous where small operating point changes of the heater current are required, but high control constancy and small control transients are required.

Instead of using a signal frequency with a variable duty cycle, other forms of modulation of the signal transmission can basically be used as well (e.g., amplitude or frequency modulation of the signal voltage), but they place more stringent requirements on the connecting lines between the transmitter and the receiver and they increase the expenditure required for recovering the information.

The foregoing is a description corresponding in substance to German application No. P 33 45 036.6, filed Dec. 13, 1983, the International priority of which is being claimed for the instant application and which is hereby made part of this application. Any material discrepancies between the foregoing specification and the aforementioned corresponding German application are to be resolved in favor of the latter.

I claim:

1. Circuit for measuring anode current in an X-ray tube having an anode and a heater electrode both operable at high voltage, comprising a heater transformer generating current pulses with a time-wise constant first pulse repetition frequency and an adjustable duty cycle, a first frequency separator connected in series with said heater transformer for receiving the output thereof, a high voltage-proof transformer having a primary winding connectd in series with said first frequency separator, and separate first and secondary windings, said first secondary winding being connected to said heater for supplying heater current for the X-ray tube, an anode circuit connected to the anode of the X-ray tube including a current/duty cycle converter generating a current with a constant second pulse repetition frequency different from said first pulse repetition frequency, said first secondary winding being connected to said current/duty cycle converter for supplying voltage from said high voltage-proof transformer, a second frequency separator connected between said current/duty cycle converter and said second secondary winding of said high voltage-proof transformer for receiving an output signal of said current/duty cycle converter and preventing said first pulse repetition frequency from passing, a duty cycle/voltage converter having an output voltage proportional to the mode current of the X-ray tube, and a third frequency separator connected to said duty cycle/voltage converter together being shunted across said primary winding of said high voltage-proof transformer, said third frequency separator passing said second pulse repetition frequency and preventing said first pulse repetition frequency from passing, and voltage measuring means for measuring said output voltage proportional to the anode current of the X-ray tube.

2. Circuit according to claim 1, including a fourth frequency separator connected between said second secondary winding and said current/duty cycle converter for passing said first pulse repetition frequency, said first pulse repetition frequency generated by said heater transformer being higher than said second pulse repetition frequency generated by said current/duty cycle converter, said first and fourth frequency separators being highpass filters, and said second and third frequency separators being lowpass filters.

3. Circuit according to claim 2, wherein said first pulse repetition frequency is substantially 20 kHz and said second pulse repetition frequency is substantially 1 kHz.

4. Circuit according to claim 1, wherein said current/duty cycle converter and said duty cycle/voltage converter have a smaller power loss than the power loss in the heater of the X-ray tube, and said current/duty cycle converter generates a flux change in said high voltage-proof transformer which is smaller than the flux change generated in said high voltage-proof transformer by said heater transformer.

5. Circuit according to claim 1, wherein said current/duty cycle converter is connected in series with the heater of the X-ray tube and said first secondary winding, for voltage supply.

* * * * *